US007777549B2

(12) United States Patent
Harada

(10) Patent No.: US 7,777,549 B2
(45) Date of Patent: Aug. 17, 2010

(54) LEVEL SHIFTER CIRCUIT

(75) Inventor: Kenji Harada, Nomi (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 0 days.

(21) Appl. No.: 12/369,982

(22) Filed: Feb. 12, 2009

(65) Prior Publication Data

US 2009/0231014 A1 Sep. 17, 2009

(30) Foreign Application Priority Data

Mar. 12, 2008 (JP) ............................ 2008-062751

(51) Int. Cl.
*H03L 5/00* (2006.01)

(52) U.S. Cl. .......................... 327/333; 327/72; 327/74; 326/62

(58) Field of Classification Search ...................... None
See application file for complete search history.

(56) References Cited

U.S. PATENT DOCUMENTS 5,821,780 A * 10/1998 Hasegawa .................... 327/63
6,144,232 A * 11/2000 Yukawa et al. ................ 327/77
6,624,667 B2 * 9/2003 Nii .............................. 327/77
6,628,146 B2 * 9/2003 Tam ............................ 327/63
6,686,899 B2 * 2/2004 Miyazawa et al. .......... 345/100
7,295,647 B2 11/2007 Harada
7,528,643 B2 * 5/2009 Kimura ...................... 327/310
2003/0001616 A1 * 1/2003 Fujikawa et al. .............. 326/80

FOREIGN PATENT DOCUMENTS

JP 2007-178451 7/2007

* cited by examiner

*Primary Examiner*—Tuan Lam
(74) *Attorney, Agent, or Firm*—Oblon, Spivak, McClelland, Maier & Neustadt, L.L.P.

(57) ABSTRACT

A level shifter circuit which amplifies the amplitude of an input signal, includes a CMOS inverter which is composed of a p-type transistor and an n-type transistor, a first and a second capacitor one electrode of each of which is connected to the gate of the p-type transistor and that of the n-type transistor, respectively, a first switch which supplies the input signal to the other electrodes of the first and second capacitors, a second switch which applies a direct-current voltage whose amplitude is nearly half of the amplitude of the input signal to the other electrodes of the first and second capacitors, and a third and a fourth switch which apply a first and a second preset voltage to one electrode of each of the first and second capacitors, respectively.

4 Claims, 5 Drawing Sheets

LEVEL SHIFTER CIRCUIT

CROSS-REFERENCE TO RELATED APPLICATIONS

This application is based upon and claims the benefit of priority from prior Japanese Patent Application No. 2008-062751, filed Mar. 12, 2008, the entire contents of which are incorporated herein by reference.

BACKGROUND OF THE INVENTION

1. Field of the Invention

This invention relates to a level shifter circuit which converts a low-level input signal into a high-level output signal.

2. Description of the Related Art

With the recent progress of semiconductor technology, the transistor threshold voltage has been getting lower in the control driving circuit of a display unit, which enables the driving voltage of the controller IC to be made lower than before. In addition, a lower power consumption of applications has been strongly desired. For these reasons, the output signal of the controller IC tends to decrease in amplitude. Moreover, to reduce unnecessary radiation (EMI) noise, a lower-amplitude transfer of the interface signal has been strongly desired.

Therefore, it is desirable that a driving circuit equivalent to a driving IC should be composed of transistors in the substrate to enable the input signal supplied to the driving IC to directly operate the driving circuit in the substrate. However, because of the restrictions on use in the substrate, it may be necessary to amplify the amplitude of the input signal. In this case, a level shifter circuit for amplifying the amplitude of the signal is used (refer to Jpn. Pat. Appln. KOKAI Publication No. 2007-178451).

However, when a peripheral circuit is formed on the same glass substrate using the same process as forming a pixel transistor as in a liquid-crystal display unit using thin-film transistors or an electroluminescent display unit, the transistor threshold value is more difficult to control than in a single-crystal silicon semiconductor and a fluctuation in the threshold voltage due to variations in the processes is particularly large. For these reasons, receiving the low-amplitude signal output from the controller IC, the level shifter circuit formed on the glass substrate sometimes failed to operate properly.

BRIEF SUMMARY OF THE INVENTION

According to an aspect of the invention, there is provided a level shifter circuit which amplifies the amplitude of an input signal, the level shifter circuit comprising: a CMOS inverter which is composed of a p-type transistor and an n-type transistor; a first and a second capacitor one electrode of each of which is connected to the gate of the p-type transistor and that of the n-type transistor, respectively; a first switch which supplies the input signal to the other electrodes of the first and second capacitors; a second switch which applies a direct-current voltage whose amplitude is nearly half of the amplitude of the input signal to the other electrodes of the first and second capacitors; and a third and a fourth switch which apply a first and a second preset voltage to one electrode of each of the first and second capacitors, respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Hereinafter, referring to the accompanying drawings, embodiments of the invention will be explained.

First Embodiment

Figure 1:
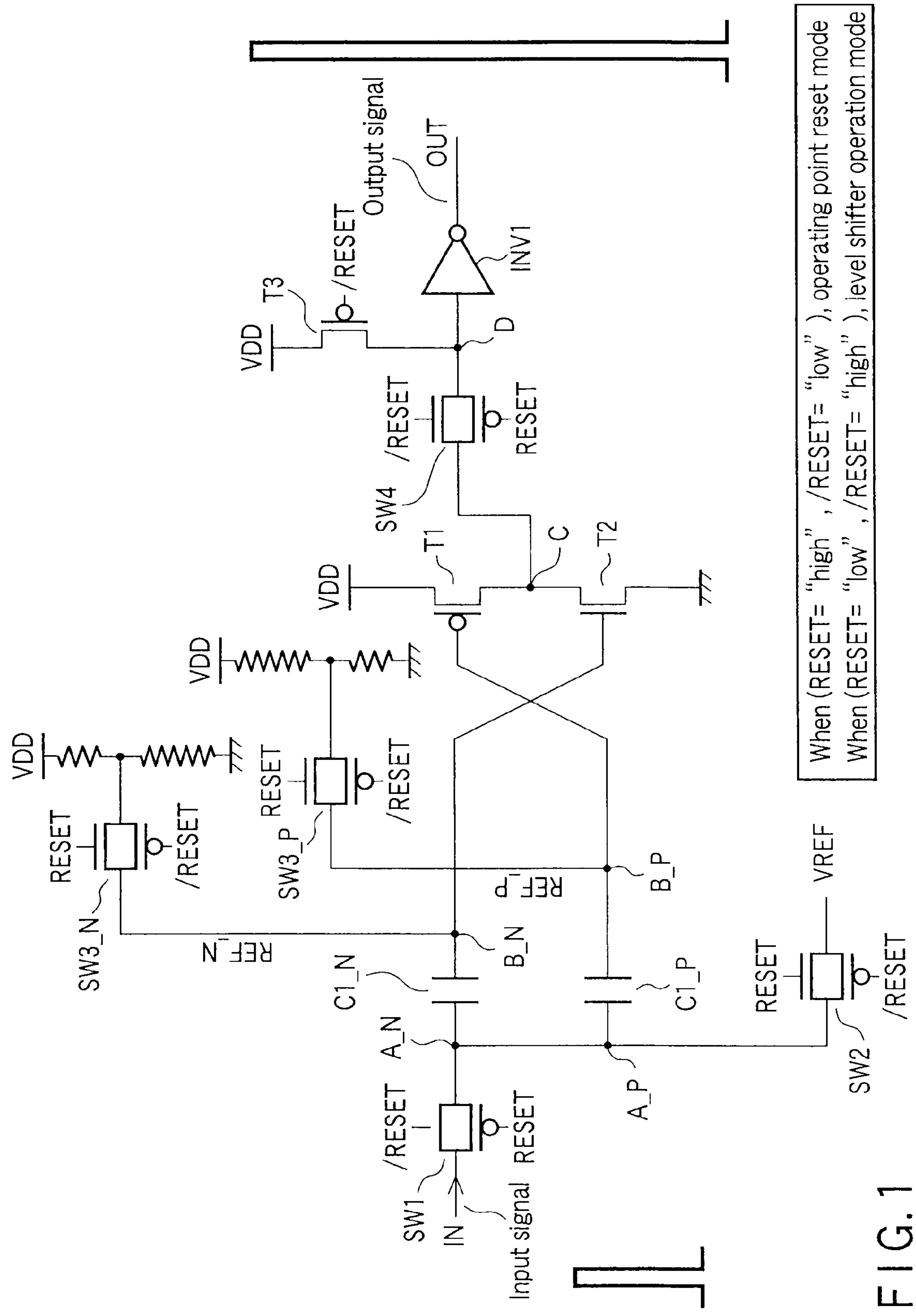
FIG. 1 is a circuit diagram showing the configuration of a part of a level shifter circuit according to a first embodiment of the invention.

FIG. 1 is a circuit diagram showing the configuration of a part of a level shifter circuit 1 according to a first embodiment of the invention. Connected to the level shifter circuit are an input signal IN, a reference voltage VREF, a reset signal RESET, an inverted signal of the reset signal /RESET (hereinafter, referred to as the inverted signal /RESET), a power supply voltage VDD, and an output signal OUT.

The input signal IN, a low amplitude signal, is converted into an output signal OUT whose high voltage level is VDD. Reference voltage VREF is a direct-current voltage corresponding to about half the amplitude of the input signal IN. The reset signal RESET and inverted signal /RESET, which are for changing the operation mode of the level shifter circuit 1, are generated by an external circuit (not shown).

Switches SW1, SW2, SW3_N, SW3_P, SW4 are two-terminal switches which are opened and closed by the reset signal RESET and inverted signal /RESET.

The input signal IN is supplied to one end of switch SW1. A circuit node A_N and a circuit node A_P are connected to the other end of switch SW1. Reference voltage VREF is supplied to one end of switch SW2. Circuit node A_N and circuit node A_P are connected to the other end of switch SW2.

One electrode of capacitor C1_N is connected to circuit node A_N. One electrode of capacitance C1_P is connected to circuit node A_P.

One end of switch SW3_N and the gate of an n-type transistor T2 are connected to a circuit node B_N to which the other electrode of capacitor C1_N is connected. One end of switch SW3_P and the gate of a p-type transistor T1 are connected to a circuit node B_P to which the other electrode of capacitor C1_P is connected.

A divided voltage REF_N of the power supply voltage VDD is applied to the other end of switch SW3_N. A divided voltage REF_P of the power supply voltage VDD is applied to the other end of switch SW3_P.

The source of transistor T1 is connected to the power supply voltage VDD. The source of transistor T2 is grounded. The drains of transistors T1 and T2 are connected to a circuit node C.

One end of switch SW4 is connected to circuit node C. The drain of a transistor T3 and the input end of an inverter INV1 are connected to a circuit node D to which the other end of switch SW4 is connected. The source of transistor T3 is connected to the power supply voltage VDD. The inverted signal /RESET is input to the gate of transistor T3.

Next, the operation of the level shifter circuit 1 will be explained. The level shifter circuit 1 operates in an operating point reset mode or a level shifter operation mode.

When the reset signal RESET is high and the inverted signal /RESET is low, the level shifter circuit 1 is in the operating point reset mode. In the operating point reset mode, switches SW2, SW3_N, SW3_P are on and switch SW1, SW4 are off.

Reference voltage VREF is applied to circuit node A_N at one end of capacitor C1_N and to circuit node A_P at one end of capacitor C1_P. Reference voltage VREF is a direct-current voltage whose amplitude is about half the amplitude of the input signal IN.

Reference voltage REF_N obtained by voltage-dividing the power supply voltage VDD is applied to the other electrode of capacitor C1_N. Accordingly, the potential at the gate of transistor T2 is preset to reference voltage REF_N.

Reference voltage REF_P obtained by voltage-dividing the power supply voltage VDD is applied to the other electrode of capacitor C1_P. Accordingly, the potential at the gate of transistor T1 is preset to reference voltage REF_P.

Figure 2:
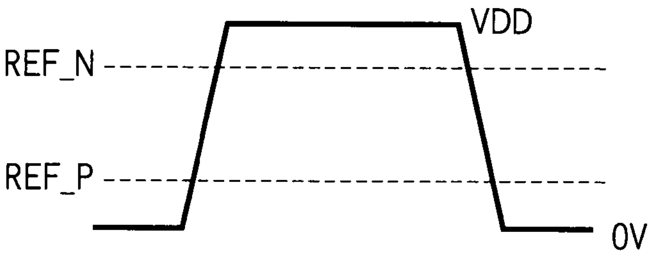
FIG. 2 is a diagram showing the relationship between the reference voltage and power supply voltage.

FIG. 2 is a diagram showing the relationship between reference voltages REF_N and REF_P and power supply voltage VDD.

Since in this mode, switch SW4 is off, the output of a CMOS inverter composed of transistors T1 and T2 is cut off. On the other hand, since transistor T3 is on, the voltage VDD is applied to a circuit node C, which produces an input signal to the inverter INV1. Consequently, the output signal OUT goes to the GND level. Accordingly, in the operating point reset mode, the output signal OUT is at the GND level, regardless of the input signal IN.

When the reset signal RESET is low and the inverted signal /RESET is high, the level shifter circuit 1 is in the level shifter operation mode. In the level shifter operation mode, switches SW2, SW3_N, SW3_P are off and switches SW1, SW4 are on.

When switch SW1 goes on, this causes the input signal IN to be supplied to circuit node A_N, one end of capacitor C1_N. The voltage at circuit node A_N has been set to reference voltage VREF in the operating point reset mode. Accordingly, the voltage at circuit node A_N changes by the difference voltage ΔV_N between the input signal In and reference voltage VREF.

Therefore, the voltage at circuit node B_N, the other end of capacitor C1_N, changes to the value obtained by adding the difference voltage ΔV_N to the held reference voltage REF_N. Accordingly, gate voltage Vg2 of transistor T2 is expressed by Equation 1:

$$T2g = REF\_N + (IN - VREF) \quad (1)$$

Similarly, gate voltage Vg1 of transistor T1 is expressed by Equation 2:

$$T1g = REF\_P + (IN - VREF) \quad (2)$$

Figure 3:
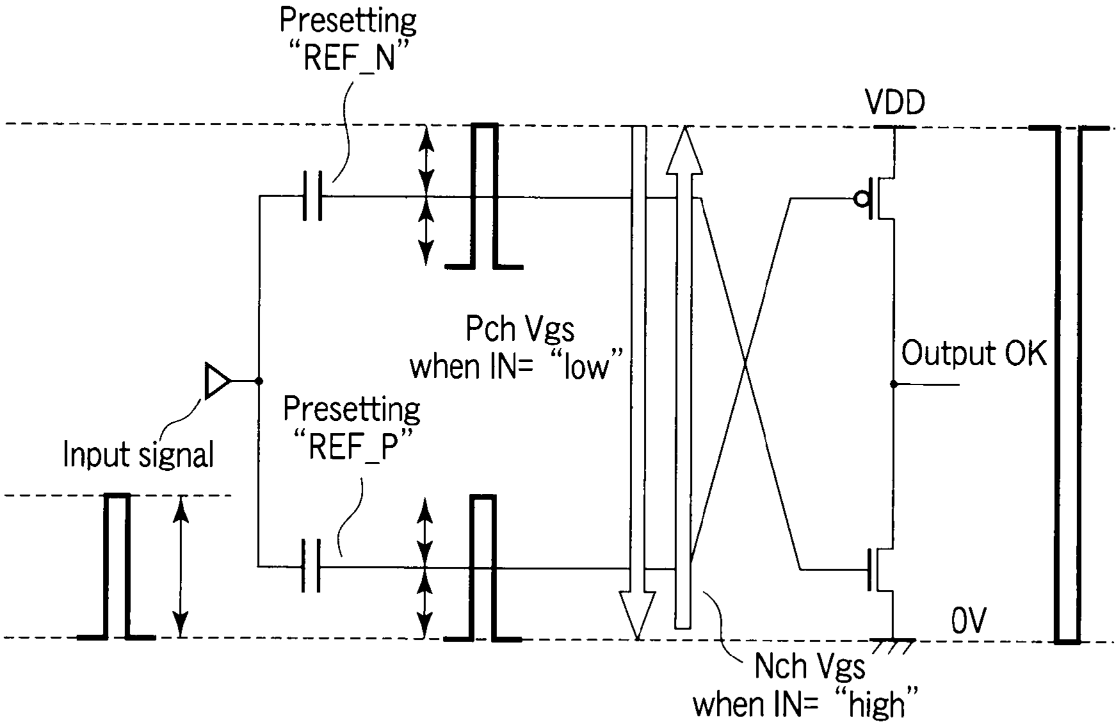
FIG. 3 is a diagram showing the gate voltages applied to the individual transistors.

FIG. 3 is a diagram showing the gate voltages applied to transistors T1 and T2.

In transistor T2, since reference voltage VREF has been set to about half the input signal IN in Equation 1, gate voltage Vg2 has the same amplitude as that of the input signal IN, with reference voltage REF_N at the midpoint.

This enables gate voltage Vg2 of transistor T2 to be raised up to VDD by adjusting reference voltage REF_N. That is, gate-source voltage Vgs2 of transistor T2 can be changed up to VDD by adjusting reference voltage REF_N. Accordingly, transistor T2 can be turned on reliably by setting gate-source voltage Vgs2 higher than threshold voltage Vth2 of transistor T2.

Similarly, in transistor T1, since reference voltage VREF has been set to about half the input signal IN in Equation 2, gate voltage Vg1 has the same amplitude as that of the input signal IN, with reference voltage REF_P at the midpoint.

This enables gate voltage Vg1 of transistor T1 to be lowered to a voltage as low as the GND level by adjusting reference voltage REF_P. That is, gate-source voltage Vgs1 of transistor T1 can be changed up to VDD by adjusting reference voltage REF_P. Accordingly, transistor T1 can be turned on reliably by setting gate-source voltage Vgs1 higher than threshold voltage Vth1 of transistor T1.

As described above, setting reference voltage REF_N and reference voltage REF_P independently so as to correspond to the threshold voltages of transistors T2 and T1 makes it possible to stabilize the operation of the CMOS inverter.

Next, the operation of the CMOS inverter when the input signal IN is high and low will be explained.

When the input signal IN is high, gate-source voltage Vgs2 of transistor T2 is higher than threshold voltage Vth2 as described above, which causes transistor T2 to go on. Moreover, since gate-source voltage Vgs1 of transistor T1 is lower than threshold voltage Vth1, transistor T2 goes off. Consequently, the potentials at circuit node C and circuit node D go to the GND level, which causes the voltage of the output signal OUT to be at VDD via the inverter INV1.

When the input signal IN is low, gate-source voltage Vgs2 of transistor T2 is lower than threshold voltage Vth2 as described above, which causes transistor T2 to go off. Moreover, since gate-source voltage Vgs1 of transistor T1 is higher than threshold voltage Vth1, transistor T2 goes on. Consequently, the potentials at circuit node C and circuit node D go to VDD, which causes the output signal OUT to go to the GND level via the inverter INV1.

The features of the level shifter circuit 1 of the first embodiment will be explained in comparison with a conventional level shifter circuit.

Figure 4:
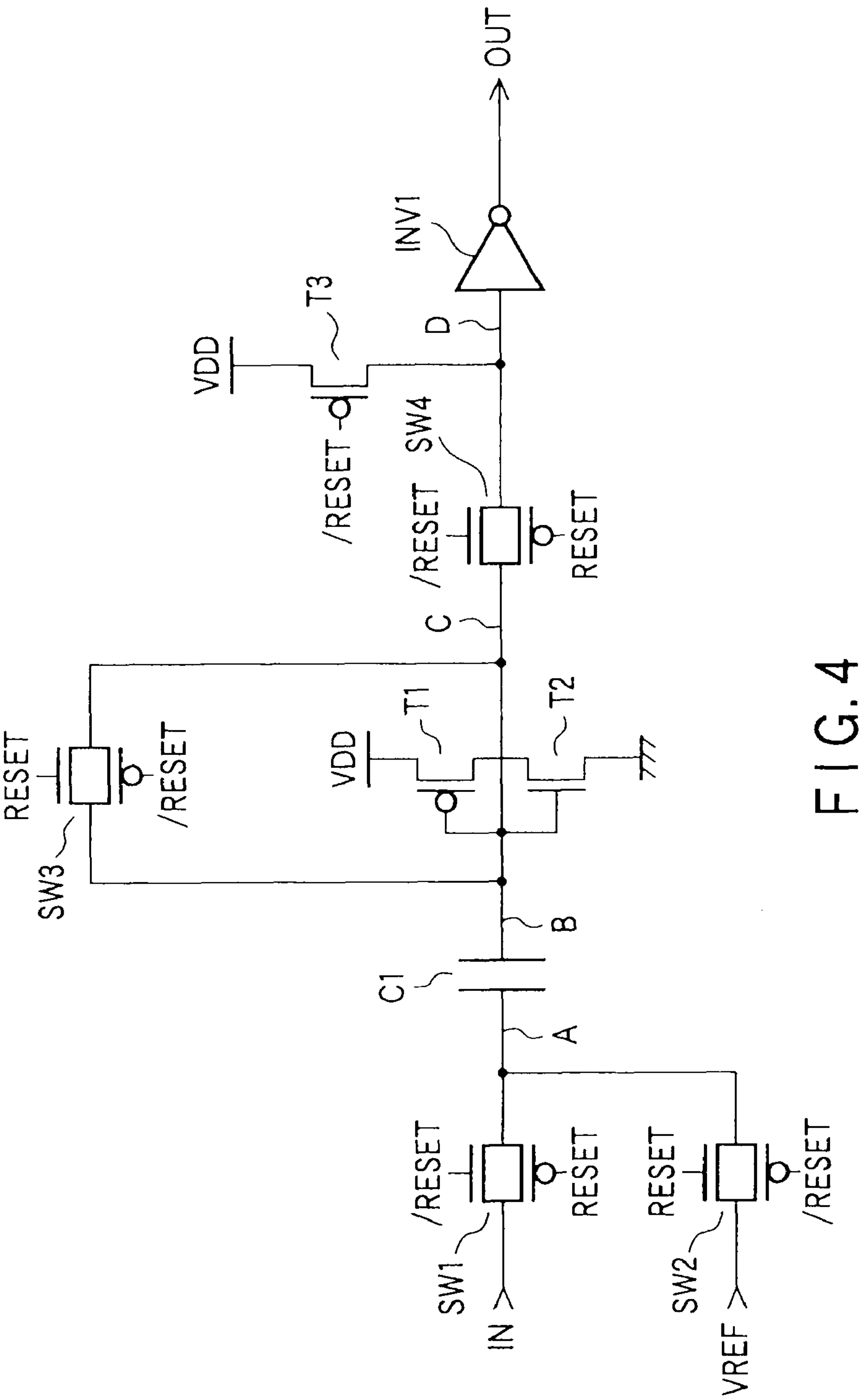
FIG. 4 PRIOR ART
FIG. 4 is a circuit diagram of a conventional level shifter circuit.

FIG. 4 is a circuit diagram of a conventional level shifter circuit.

The conventional level shifter circuit differs from that of the first embodiment in the configuration of the circuit from circuit node A to circuit node C which applies the gate voltage mainly to the CMOS inverter. Therefore, the same parts are indicated by the same reference numerals and an explanation of them will be omitted.

In the conventional level shifter circuit, a common gate voltage is applied to transistors T1 and T2 constituting the CMOS inverter. The input and output of the CMOS inverter are short-circuited, thereby presetting the threshold voltage of the CMOS inverter to capacitor C1. Consequently, the gate voltages of transistors T1 and T2 have the same amplitude as that of the input signal IN, with the preset threshold voltage at the midpoint.

Figure 5:
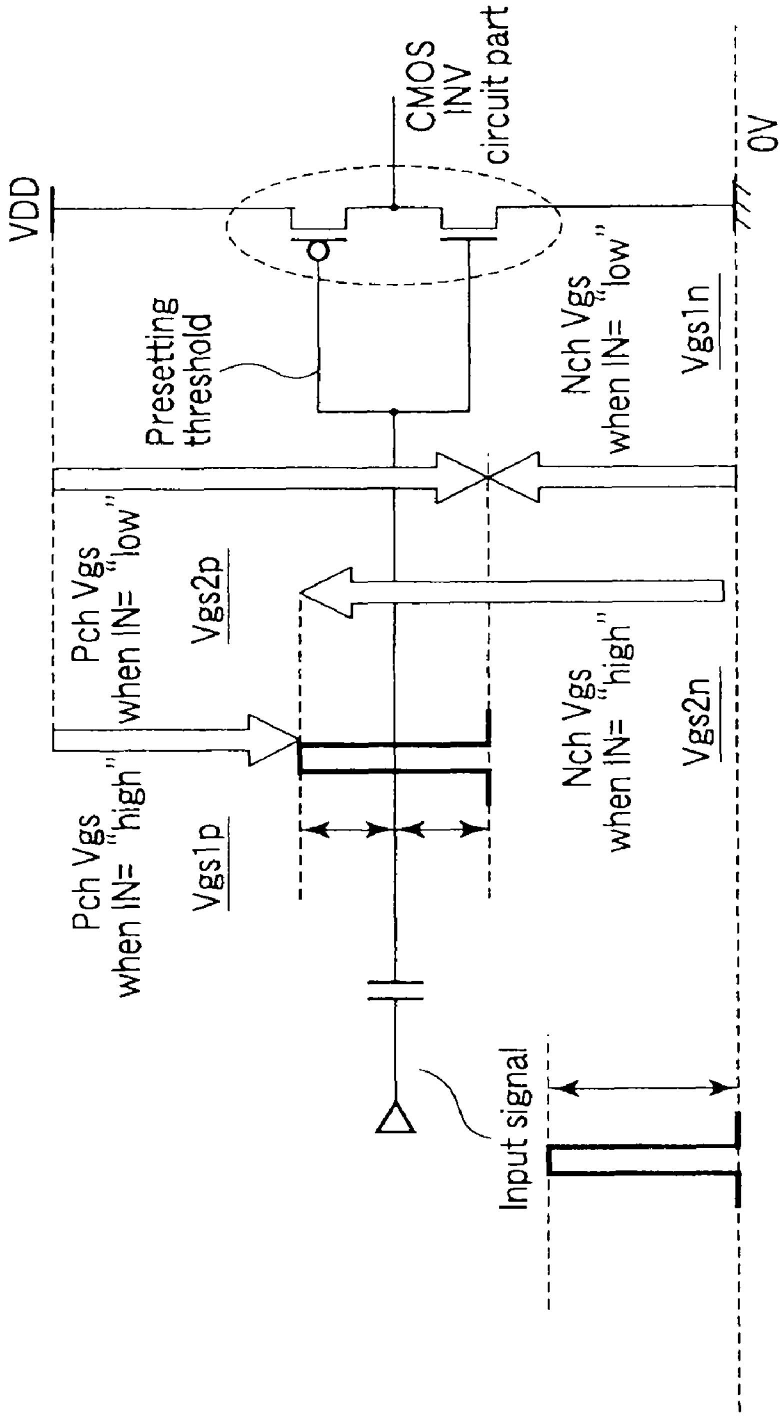
FIG. 5 PRIOR ART
FIG. 5 is a diagram showing the gate voltages applied to the individual transistors in the conventional level shifter circuit.

FIG. 5 is a diagram showing the gate voltages applied to transistors T1 and T2 in the conventional level shifter circuit.

As shown in FIG. 5, in the conventional level shifter circuit, the sum of gate-source voltage Vgs1 of p-channel transistor T1 and gate-source voltage Vgs2 of n-channel transistor T2 is at a constant value (=VDD). That is, the gate-source voltage of one of the transistors is determined, depending on the gate-source voltage of the other transistor.

Accordingly, when the operation margin is narrow for process variations since the amplitude of the input signal is small and the power supply voltage VDD is low, the threshold value of p-channel transistor T1 is lower than gate-source voltage Vgs1, or the threshold value of n-channel transistor T2 is lower than gate-source voltage Vgs2, allowing the transistor to go on when it was supposed to go off, which causes the circuit to malfunction.

Furthermore, the threshold value of p-channel transistor T1 is higher than gate-source voltage Vgs1, or the threshold value of n-channel transistor T2 is higher than gate-source voltage Vgs2, allowing the transistor to go off when it was supposed to go on, which causes the circuit to malfunction.

Even if a malfunction can be avoided, the switching operation is liable to go on in the unsaturated area because a sufficient gate-source voltage is not applied in the on/off operation.

Furthermore, because of the imbalance between the n-channel characteristic and the p-channel characteristic, the waveform of the output signal from the signal converter circuit becomes dull, which sometimes leads to Duty corruption. Thus, there is a limit to the frequency usable in the conventional level shifter.

In contrast, the level shifter 1 of the first embodiment uses reference voltage REF_N and reference voltage REF_P as preset voltages. Reference voltage REF_N and reference voltage REF_P can be set independently. For example, they can be set to suitable values, depending on the amplitude of the input signal IN and the power supply voltage VDD. Accordingly, a suitable operation margin can be secured for process variations, which enables the level shifter circuit to operate well even with a high-frequency input signal.

Second Embodiment

Next, referring to FIG. 6, an active-matrix liquid-crystal display unit using the level shifter circuit of the first embodiment will be explained.

Figure 6:
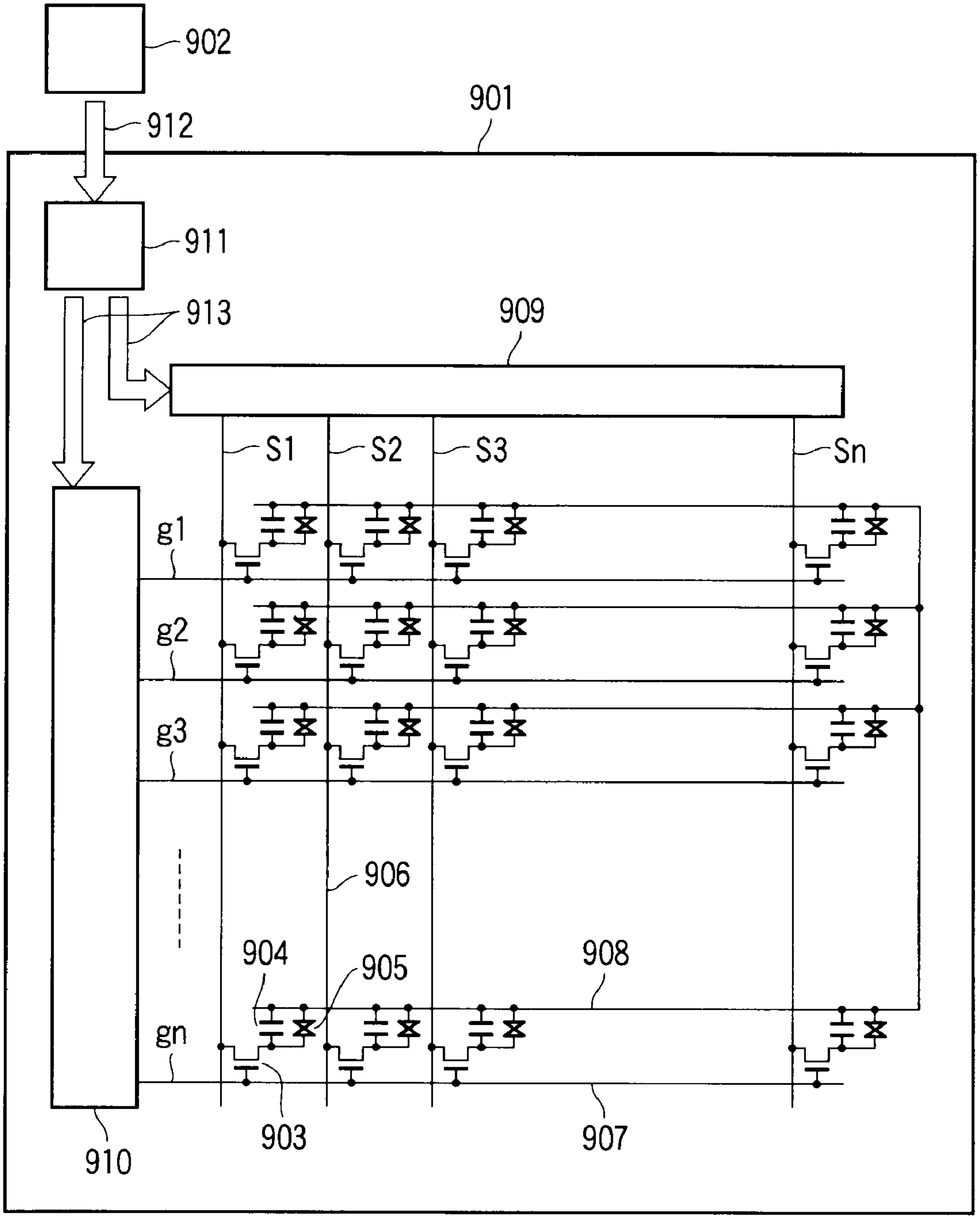
FIG. 6 is a circuit diagram showing the configuration of an active-matrix liquid-crystal display unit using the level shifter circuit of the first embodiment.

The active-matrix liquid-crystal display unit 901 of FIG. 6 is, for example, a flat-panel liquid-crystal display unit. The active-matrix liquid-crystal display unit 901, which is composed of an integrated circuit using thin-film transistors, includes a signal level converter circuit 911. The signal level converter circuit 911 includes not only the level shifter circuit 1 of the first embodiment but also an initializing circuit for generating a reset signal RESET and an inverted signal /RESET.

A controller 902, which is composed of, for example, a CMOS gate array, controls the liquid-crystal display circuit unit 901. A control signal 912 with, for example, a 1-V low signal amplitude from the controller 902 is input as the input signal 9 to the signal level converter circuit 911 included in the liquid-crystal display unit 901. The signal level converter circuit 911 converts the input signal 9 into a control signal 913 with, for example, about a 5-V high signal amplitude corresponding to the output signal 14. The control signal 913 with the high signal amplitude is supplied to a source driving circuit 909 and a gate driving circuit 910.

At the interconnections of a plurality of gate lines g1, g2, g3, . . . , gn connected to the gate driving circuit 910 and arranged in parallel and a plurality of source lines s1, s2, s3, . . . , sm connected to the source driving circuit 909 and provided in parallel so as to cross the gate lines, thin-film transistors 903 each of whose gates is connected to the corresponding gate line and each of whose sources is connected to the corresponding source line are provided in a one-to-one correspondence. Connected to the drain of the thin-film transistor 903 are one electrode of a storage capacitor 904 and a liquid-crystal capacitor 905 connected in parallel with the storage capacitor 904. The other electrode of the storage capacitor 904 and that of the liquid-crystal capacitor 905 are connected to a common electrode line 908.

Then, supplied to the gate driving circuit 910 and the source driving circuit 909 is, for example, the control signal with about a 5-V high signal amplitude converted by the signal level converter circuit 911 as described above. The gate driving circuit 910 scans the individual gate lines sequentially according to the control signal. The source driving circuit 909 inputs an image signal via the source line to the pixel part specified by the gate line selected by the gate driving circuit 910. As a result, an image is displayed.

As described above, incorporating the level shifter circuit into the active-matrix liquid-crystal display unit 901 using thin-film transistors makes it possible to directly control the display unit using a small signal from, for example, a CMOS IC gate array. Consequently, it is possible to realize not only a liquid-crystal unit compatible with a high-speed interface signal but also high-resolution imagery and image representation complying with a high operating frequency standard.

Use of the level shifter circuit of the invention enables the amplitude of the interface signal to be made lower than the threshold voltage of the transistors formed in the liquid-crystal display unit 901. Therefore, the amplitude of the interface signal can be made smaller than before and therefore unnecessary radiation (EMI) noise can be reduced.

While the invention has been applied to a liquid-crystal display unit in the above embodiments, a similar interface circuit may be applied to an electroluminescent display unit. This makes it possible to realize an electroluminescent display unit which produces the same effect as that of the above-described liquid-crystal display unit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A level shifter circuit which amplifies the amplitude of an input signal, the level shifter circuit comprising:

a CMOS inverter which is composed of a p-type transistor and an n-type transistor;

a first and a second capacitor one electrode of each of which is connected to the gate of the p-type transistor and that of the n-type transistor, respectively;

a first switch which supplies the input signal to the other electrodes of the first and second capacitors;

a second switch which applies a direct-current voltage whose amplitude is nearly half of the amplitude of the input signal to the other electrodes of the first and second capacitors; and a third and a fourth switch which apply a first and a second preset voltage to one electrode of each of the first and second capacitors, respectively.

2. The level shifter circuit according to claim 1, wherein the first and second preset voltages are configured to set independently.

3. The level shifter circuit according to claim 2, wherein the level shifter circuit is configured to operate in the following two modes:

an operating point reset mode in which the level shifter circuit applies not only the first and second preset voltages to one electrode of each of the first and second capacitors, respectively, but also the direct-current voltage to the other electrodes of the first and second capacitors, and a level shifter operation mode in which the level shifter circuit amplifies the amplitude of the input signal and outputs the amplified signal at the COMS inverter.

4. The level shifter circuit according to claim 3, wherein control is performed in such a manner that the second switch, third switch, and fourth switch go on in the operating point reset mode, and the first switch goes on in the level shifter operation mode.

* * * * *